United States Patent
Shaizaf et al.

(10) Patent No.: US 7,761,760 B2
(45) Date of Patent: Jul. 20, 2010

(54) INTEGRATED CIRCUIT AND A METHOD FOR DESIGNING A BOUNDARY SCAN SUPER-CELL

(75) Inventors: Erez Shaizaf, Moshav (IL); Kostya Korchomkin, Arad (IL); Tal Mazor, Brei-Brak (IL)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 11/913,441

(22) PCT Filed: May 4, 2005

(86) PCT No.: PCT/IB2005/001215

§ 371 (c)(1),
(2), (4) Date: Nov. 2, 2007

(87) PCT Pub. No.: WO2006/117588

PCT Pub. Date: Nov. 9, 2006

(65) Prior Publication Data

US 2008/0204076 A1    Aug. 28, 2008

(51) Int. Cl.
*G01R 31/28* (2006.01)
(52) U.S. Cl. .......................... 714/727; 326/16
(58) Field of Classification Search ......... 714/724–727; 326/16

See application file for complete search history.

(56) References Cited

U.S. PATENT DOCUMENTS

| 5,828,827 | A | 10/1998 | Mateja et al. |
| 6,266,793 | B1 * | 7/2001 | Mozdzen et al. ............ 714/727 |
| 6,314,539 | B1 * | 11/2001 | Jacobson et al. ............ 714/727 |
| 6,586,921 | B1 * | 7/2003 | Sunter ..................... 324/76.11 |
| 2001/0014959 | A1 * | 8/2001 | Whetsel ..................... 714/724 |
| 2004/0044937 | A1 * | 3/2004 | Dubey ......................... 714/727 |
| 2008/0204076 | A1 * | 8/2008 | Shaizaf et al. ................ 326/62 |

FOREIGN PATENT DOCUMENTS

EP    0503926 B1    6/1997

* cited by examiner

*Primary Examiner*—James H. Cho
*Assistant Examiner*—Jason Crawford
(74) *Attorney, Agent, or Firm*—Reches Patents

(57) ABSTRACT

A method for designing an integrated circuit, the method includes: providing an initial definition of a boundary scan register that includes identical super-cells adapted to be connected to multiple pin types; and determining the configuration of each super-cell by providing at least one pin type indication signal to each super-cell. An integrated circuit that includes a boundary scan super-cell, the boundary scan super-cell includes first circuitry adapted to be connected to at least one type of integrated circuit pin; characterized by further including a second circuitry, connected to first circuitry, wherein the second circuitry is adapted to receive at least one pin type indication signal and in response allows the boundary scan super-cell to be connected to at least one additional type of an integrated circuit pin.

13 Claims, 10 Drawing Sheets

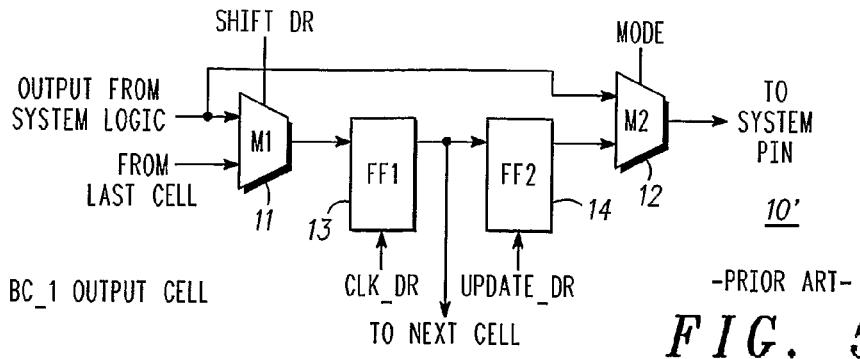
BC_1 OUTPUT CELL
FIG. 5 -PRIOR ART-
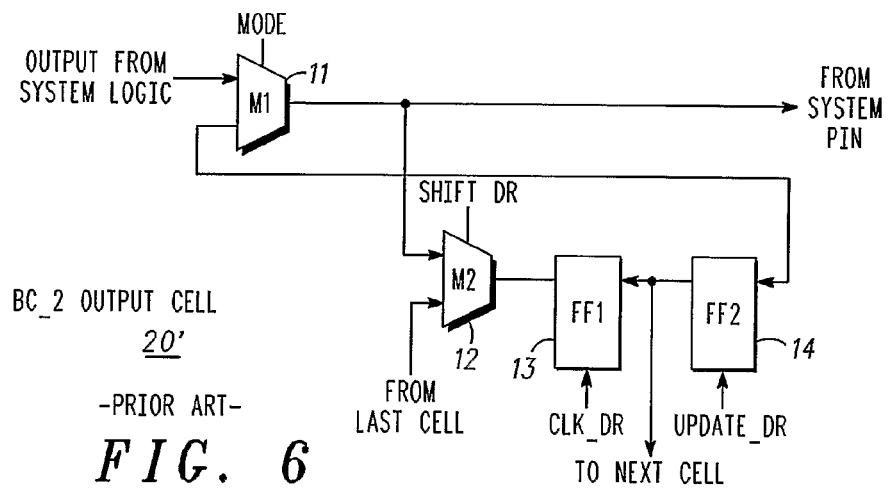
BC_2 OUTPUT CELL
20'
-PRIOR ART-
FIG. 6
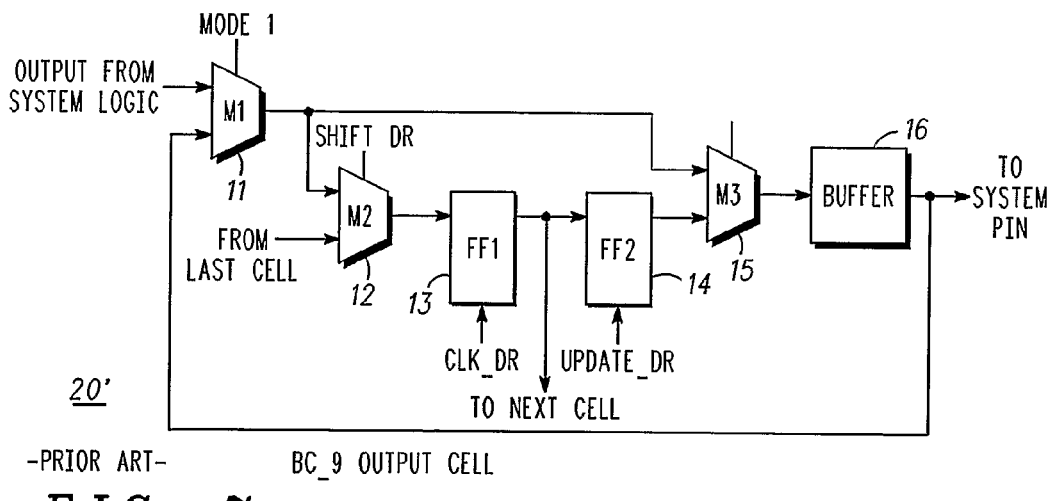
20'
-PRIOR ART-  BC_9 OUTPUT CELL
FIG. 7

-PRIOR ART-

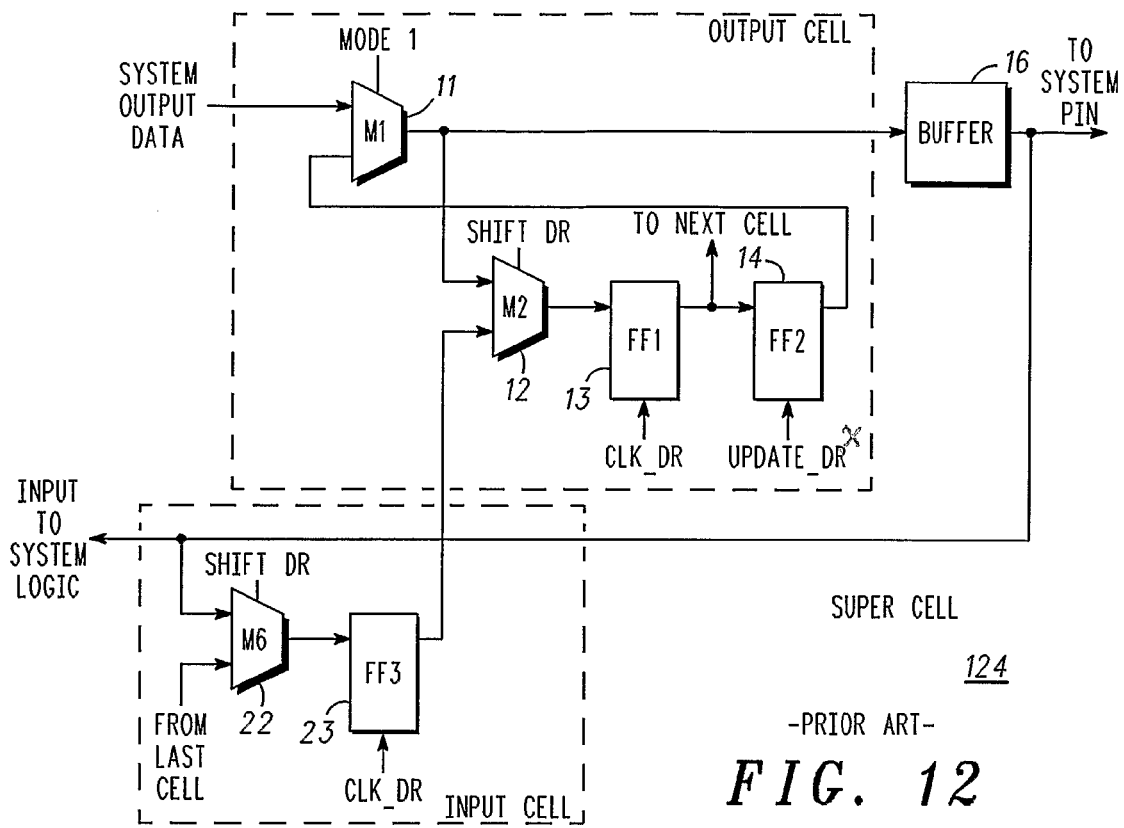
FIG. 12 -PRIOR ART-
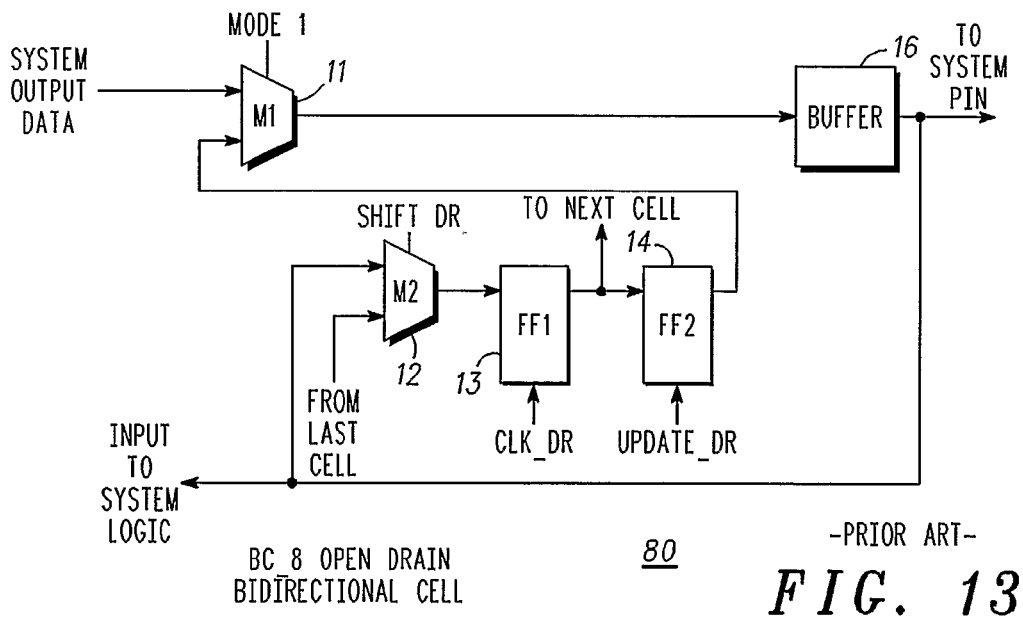
BC_8 OPEN DRAIN BIDIRECTIONAL CELL
FIG. 13 -PRIOR ART-

—PRIOR ART—

INTEGRATED CIRCUIT AND A METHOD FOR DESIGNING A BOUNDARY SCAN SUPER-CELL

Continuation Data

This application is a 371 of PCT/IB2005/001215 filed on May 4, 2005.

FIELD OF THE INVENTION

The present invention relates to an integrated circuit that includes a multiple boundary scan super-cells and for a method for designing a super-cell.

BACKGROUND OF THE INVENTION

The complexity of integrated circuits forced designers to use various testing procedures and architectures. One common architecture and protocol is defined at IEEE standard 1149.1 that is also known as JTAG. The IEEE standard 1149.1 defines a test access port (TAP) that may be used to access internal components of an integrated circuit.

The TAP includes a TAP controller as well as multiple registers such as a boundary scan register, a one-bit long bypass register, an instruction register and one or more optional user defined data register. The TAP dynamically defines a data path that is provided with an input signal TDI and output an output signal TDO.

Generally, the TAP controller sends control signals that allow to input information into selected data and instruction paths, to retrieve information from said paths and to serially propagate (shift) information along data and instruction paths.

The TAP controller receives various signals such as a clock signal TCK, and test mode select signal TMS and outputs multiple control signals to the various registers. The TAP controller is a state machine that has a large number of states, including various IEEE standard 1149.1 mandatory states such as SHIFT DR state, EXIT DR state, CAPTURE DR state, UPDATE DR state, SELECT DR SCAN state and the like. During the SHIFT DR state the data is serially shifted during the data path by a single stage. In this state SHIFT DR signal is provided.

The boundary scan register is a shift register that includes various boundary scan cells or super-cells. Each boundary scan cell or super-cell is designed to be connected to a single type of integrated circuit pin such as a two state input pin, a bi-directional pin, tri-state output pin, two state output pin, open drain (also referred to as open collector) output pin and a bi-directional open drain pin.

The term "super-cell" means a boundary scan register building unit that includes multiple boundary scan cells. The IEEE 1149.1 refers to both cells and super-cells as "cells" but for clarity of explanation different terms are being used to distinguish between a single cell and circuitry that include multiple cells.

A typical boundary scan cell or super-cell includes a serial input and serial output that are connected to other boundary scan cells (or super-cells) as well as a parallel input and a parallel output that are connected to other components such as integrated circuit logic, integrated circuit pin, buffers and the like.

The boundary scan cells (or super-cells) are connected via buffers to the integrated circuit pins. JTAG makes a distinction between output control signals and data signals. Output control signals would, at the absence of the boundary scan cell, drive the enable input of the buffers. The output data signals would, at the absence of the boundary scan cell, drive the data input of the buffers. Control boundary scan cells or cell portions receive the output control signals while data boundary scan cells receive the output data signals.

The IEEE standard 1449.1 defines a set of mandatory and optional instructions. The mandatory instructions include instructions such as BYPASS, SAMPLE, PRELOAD and EXTEST. The optional instructions include instructions such as INTEST, HIGHZ, RUNBIST and CLAMP.

A SAMPLE instruction allows to sample signals during a normal operation of an integrated circuit. The BYPASS instruction selects the bypass register as a data path between signals TDI and TDO. The PRELOAD allows to load data values onto the parallel outputs of the boundary scan cells. The EXTEST instruction allows to test off-integrated circuit circuitry and board level interconnections. Usually this instruction is preceded by a PRELOAD instruction. Typically, output boundary scan cells provide a test stimuli and the input boundary scan cells capture test results.

The HIGH Z places all the outputs of the integrated circuit in a high impedance state. The USERCODE and IDCODE instruction allow access to component identification information. The IDCODE selects a device identification register as a selected data path in a SHIFT DR state of the TAP controller.

The optional INTEST instruction allows to test logic of the integrated circuit. Typically, test stimuli are serially provided to the logic, and the test results are captured by the boundary scan registers and serially shifted out. The optional RUNBIST instruction causes the integrated circuit to perform a built in self test. The optional CLAMP instruction allows to determine, from the boundary scan register, the state of signals driven from component pins while the bypass register is the selected data path.

The IEEE standard 1149.1 defines different types of boundary scan cells and super-cells. The structure of each cell and super-cell is tailored according to the type of integrated circuit pin it is connected to. In many cases a buffer is connected between a cell or a super-cell and the pin. The cell is also connected to circuitry within the integrated circuit, such as logic and the like.

For simplicity of explanation, the following figures include various letters that represent various components: M represents a multiplexer, FF represents a flip-flop, A represents an AND gate, OR represents an OR gate and XOR represents a XOR gate.

FIG. 1 illustrates a first type (BC 1) input cell 10. It includes an input multiplexer M1 11, two flip flops FF1 13 and FF2 14 and an output multiplexer M2 12. An input signal to this cell arrives from an integrated circuit pin and the cell outputs the signal to the system logic. The two data inputs of M1 11 are connected to an input pin and to a preceding cell. M2 12 is controlled by SHIFT DR signal while M1 11 is controlled by MODE signal. The output of M1 11 is connected to the data input of FF1 13. The output of FF1 13 is connected to the next cell and to the data input of FF2 14. The data inputs of M2 12 are connected to the output of FF2 14 and to the pin. The output of M2 12 is connected to logic of the integrated circuit. FF1 13 is clocked by CLK_DR signal and FF2 14 is clocked by UPDATE_DR signal, both provided by the TAP controller.

FIG. 2 illustrates a second type (BC 2) input cell 20. It includes an input multiplexer M1 11, two flip flops FF1 13 and FF2 14 and an output multiplexer M2 12. An input signal to this cell arrives from an integrated circuit pin and the cell outputs the signal to the system logic. The two inputs of M1 11 are connected to the input pin and to an output of FF2 14. The output of M1 11 is connected to a data input of M2 12 and is an input signal to the logic of the integrated circuit. The second input data of M1 12 is connected to an output of a preceding cell. The output of M2 12 is connected to the data input of FF1 13. The output of FF1 13 is connected to the next cell and to the data input of FF2 14.

BC 1 input cell 10 receives an high MODE signal during the execution of an INTEST, EXEST, RUNBIST and CLAMP instructions and receives a low MODE signal during the execution of PRELOAD and SAMPLE instructions.

BC 2 input cell 20 receive an high MODE signal during the execution of an INTEST instruction, receive a low MODE signal during the execution of EXTEST, PRELOAD and SAMPLE instructions and do not receive (high impedance) MODE signal during the execution of RUNBIST and CLAMP instructions.

FIG. 3 illustrates a third type (BC 3) input cell 30. It includes an input multiplexer M1 11, a flip flop FF1 13 and an output multiplexer M2 12. An input signal to this cell arrives from an integrated circuit pin and the cell outputs the signal to the system logic. The two inputs of M1 11 are connected to the input pin and to an output of a previous cell. The output of M1 11 is connected to a data input of FF1 13. The output of FF1 13 is connected to the next cell and to the second data input of M2 12. M2 12 is controlled by MODE signal while M1 11 is controlled by SHIFT DR signal.

FIG. 4 illustrates a fourth type (BC 4) input cell 40. Cell 40 resembles cell 30 but includes a greater than one logic 15 instead of multiplexer M2 12.

FIG. 5 illustrates a first type (BC 1) output cell 10'. Cell 10' differs from cell 10 by its connectivity—the input to the cell arrives from the integrated circuit logic and the output from the cell is sent to the integrated circuit pin.

BC 1 output cell 10' receives an high MODE signal during the execution of an EXTEST, RUNBIST, INTEST and CLAMP instruction and receives a low MODE signal during the execution of PRELOAD and SAMPLE instructions.

FIG. 6 illustrates a second type (BC 2) output cell 20'. Cell 20' differs from cell 20 by its connectivity—the input to the cell arrives from the integrated circuit logic and the output from the cell is sent to the integrated circuit pin.

BC 2 output cell 20' receives an high MODE signal during the execution of an EXTEST, RUNBIST and CLAMP instruction and receives a low MODE signal during the execution of PRELOAD and SAMPLE instructions.

FIG. 7 illustrates a ninth type (BC 9) output cell 90. It includes an input multiplexer M1 11, intermediate multiplexer M2 12, two flip flops FF1 13 and FF2 14, output multiplexer M3 13 and output buffer 16. An input signal to this cell arrives from an integrated circuit logic and the cell outputs the signal to the integrated circuit pin. The two inputs of M1 11 are connected to the logic of the integrated circuit and to the output of buffer 16 that also serves as an output of the cell. The output of M1 11 is connected to a data input of M2 12 and to a data input of M3 15. The second input data of M2 11 is connected to an output of a preceding cell. The output of M2 12 is connected to the data input of FF1 13. The output of FF1 13 is connected to the next cell and to the data input of FF2 14. The output of FF2 14 is connected to a data input of M3 15. M1 11 is controlled by MODE 1 signal, M2 is controlled by SHIFT DR signal and M3 is controlled by MODE 2 signal.

MODE 1 is high during the execution of EXTEST instruction, low during the execution of SAMPLE and INTEST instructions and is not provided (high impedance) during the execution of PRELOAD, RUNBIST and CLAMP instructions. MODE 2 is high during the execution of EXTEST, INTEST, RUNBIST and CLAMP instructions and low during the execution of SAMPLE and PRELOAD instructions.

FIG. 8 illustrates a tenth type (BC 10) output cell 100. Cell 100 resembles cell 90 but does not include third multiplexer M3 15, and the data input of M2 12 is connected to the output of buffer 16, instead to the output of M1 11.

FIG. 9 illustrates a tri-state output super-cell 110 that includes a BC 1 control cell, a BC 1 data cell and a buffer 16. The BC 1 control cell controls the enable input of buffer 16 while the BC 1 data cell provides data to the data input of buffer 16. The output of buffer 16 is connected to an integrated circuit pin. The high impedance state is achieved by disabling buffer 16. The control cell resembles the data cell and both resemble BC 1 output cell 10' of FIG. 5.

For convenience of explanation, control cell includes M1 11, M2 12, FF1 13 and FF2 14 while the components of the data cell are termed M5 21, M6 22, FF3 23 and FF4 24. The inputs to M1 11 are the system output control and the output of FF3 23. The output of FF1 13 is fed to the next cell while the inputs of M5 21 are a system output data signal and data from the preceding cell. MODE is high during the execution of an EXTEST, RUNBIST, INTEST and CLAMP instruction and is low during the execution of PRELOAD and SAMPLE instructions.

FIG. 10 illustrates a tri-state output super-cell 120 that includes a BC 2 control cell, a BC 2 data cell and a buffer 16. The BC 2 control cell controls the enable input of buffer 16 while the BC 2 data cell provides data to the data input of buffer 16. The output of buffer 16 is connected to an integrated circuit pin. The high impedance state is achieved by disabling buffer 16. The data cell resembles BC 2 output cell 20' of FIG. 6. The control cell has an additional AND gate 31 that receives as input a MODE 2 signal and the output of M1 11 and sends a control signal to buffer 16. M1 11 and M5 21 are controlled by signal MODE 1.

The control cell includes M1 11, M2 12, FF1 13 and FF2 14 while the components of the data cell are termed M5 21, M6 22, FF3 23 and FF4 24. The inputs to M1 11 are the system output control and the output of FF3 23. The output of FF1 13 is fed to the next cell while the inputs of M5 21 are a system output data signal and data from the preceding cell. MODE 1 is high during the execution of EXTEST and CLAMP instructions, and is low during the execution of PRELOAD, SAMPLE, INTEST, RUNBIST and HIGHZ instructions. MODE 2 is high during the execution of EXTEST, PRELOAD, SAMPLE and CLAMP instruction and is low during the execution of INTEST, RUNBIST and HIGHZ instructions.

FIG. 11 illustrates a bidirectional super-cell 72 that includes a BC 2 control cell, a BC 7 data cell and a buffer 16. The BC 2 control cell controls the enable input of buffer 16 while the BC 7 data cell provides data to the data input of buffer 16. The BC 2 control cell is identical to the BC 2 control cell of FIG. 8, but A1 31 is controlled by MODE 3 control signal. The output of buffer 16 is connected to an integrated circuit pin for providing output signals to the pin. The pin also receives input signals that are passed, via BC 7 data cell to the logic of the integrated circuit and is referred to as input to system logic. M1 11 of the BC 2 control cell receives as input a system output control signal.

BC 7 control cell includes an input multiplexer M5 21 that receives as inputs a system output data signal and an output of FF4 24. The output of M5 21 is connected to a data input of buffer 16 and to an input of multiplexer M8 28. An AND gate A2 32 receives an inverted MODE 1 signal and the output signal of M1 11 and sends a control signal to M8 28. M8 28 receives as input the output of M5 21 and an output signal from multiplexer M9 29. The output signal of M9 29 is the input to system logic signal. The output of M8 28 is connected to an input if M6 22 while another input is connected to a previous cell. M6 22 is controlled by SHIFT DR signal. The output of M6 22 is connected to FF3 23 that in turn is serially connected to FF4 24. The output of FF4 24 is connected to an input of M9 29 and to an input of M5 21.

MODE 1 is high during the execution of EXTEST and CLAMP instructions, low during the execution of PRELOAD, SAMPLE and INTEST instructions and is not provided (high impedance) during the execution of RUNBIST and HIGHZ instructions. MODE 2 is high during the execution of INTEST instruction, low during the execution of PRELOAD, SAMPLE and EXTEST instructions and is not provided (high impedance) during the execution of RUNBIST, CLAMP and HIGHZ instructions. MODE 3 is high during the execution of EXTEST, PRELOAD, SAMPLE and CLAMP instructions and is low during the execution of HIGHZ, RUNBIST and INTEST instructions.

FIG. 12 illustrates an open drain bidirectional super-cell 124 that includes a BC 2 output cell, a BC 4 input cell and a buffer 16. The BC 2 control cell receives as input a system output data signal and send an output signal to an integrated circuit pin via buffer 16. The inputs to M2 12 are the output of M1 1 and an output signal of FF3 23. The BC 4 input cell includes M6 22 and FF3 23. The integrated circuit pin is also connected to the system logic and to an input of M6 22. M6 22 M6 22 is controlled by SHIFT DR signal. MODE is high during the execution of an EXTEST, RUNBIST, and CLAMP instruction and is low during the execution of PRELOAD and SAMPLE instructions.

FIG. 13 illustrates an eighth bidirectional cell 80 that is connected on one side to an integrated circuit pin and on the other side to an integrated circuit logic. The cell 80 receives and provides signals to both integrated circuit pin and logic.

The output of buffer 16 is connected to an integrated circuit pin for providing output signals to the pin. The pin also receives input signals that are passed to the system logic are and referred to as input to system logic. BC 8 includes an input multiplexer M1 11 that receives as inputs a system output data signal and an output of FF2 14. The output of M1 21 is connected to a data input of buffer 16. Multiplexer M2 12 receives as inputs signals from a preceding cell and the input to system logic signal. The output of M2 12 is connected to FF1 13 that in turn is serially connected to FF2 14. The output of FF1 13 is connected to next cell. M1 11 is controlled by MODE signal while M2 12 is controlled by SHIFT DR signal. MODE is high during the execution of an EXTEST and CLAMP instruction, is low during the execution of PRELOAD and SAMPLE instructions and is not provided (high impedance) during the execution of RUNBIST and HIGHZ instructions.

FIG. 14 illustrates a bidirectional super-cell 82 that includes a BC 2 control cell, a BC 8 data cell and a buffer 16. The BC 2 control cell receives as input a system output data signal and is connected to the enable input of buffer 16. A high impedance output can be achieved by disabling buffer 16. The inputs of M2 12 are connected to the output of M1 11 and to the output of FF3 23. MODE is high during the execution of an EXTEST and CLAMP instruction, is low during the execution of PRELOAD and SAMPLE instructions and is not provided (high impedance) during the execution of RUNBIST and HIGHZ instructions.

FIG. 15 illustrates a tri-state output super-cell 151 where the cell output control is provided from the integrated circuit pin. Super-cell includes a BC 5 control cell and a BC 1 data cell. The input to BC 5 control cell is a signal termed output enable integrated circuit pin.

MODE is high during the execution of an EXTEST, INTEST, RUNBIST and CLAMP instruction and is low during the execution of PRELOAD and SAMPLE instructions.

Additional boundary scan registers and cells are illustrated in the following U.S. patents and patent applications, all being incorporated herein by reference: U.S. patent application Ser. No. 20040130944 of Krause et al.; U.S. patent application Ser. No. 20020120895 of Suzuki; U.S. patent application Ser. No. 20040098648 of Sunter et al.; U.S. patent application Ser. No. 20040010740 of Tanaka; U.S. patent application publication number 20030196179 of Langford II; U.S. Pat. No. 6,304,099 of Tang et al.; U.S. Pat. No. 6,539,511 of Hashizume; U.S. patent application publication number 20020144200 of Shimomura et al.; U.S. Pat. No. 6,314,539 0F Jacobson et al.; U.S. patent application publication number 20030093730 of Halder et al. and U.S. patent application publication number 20040044937.

The vast amount of different boundary scan cell complicates the design and maintenance of boundary scan registers. In many cases the type of a certain pin changes during the design process. Such a change requires boundary scan and associated circuitry re-design.

There is a need to simplify the design of boundary scan registers.

SUMMARY OF THE PRESENT INVENTION

A boundary scan cell and a method for designing a cell, as described in the accompanying claims.

BRIEF DESCRIPTION OF THE DRAWINGS

The present invention will be understood and appreciated more fully from the following detailed description taken in conjunction with the drawings in which:

FIG. 1-15 illustrates exemplary prior art boundary scan cells and boundary scan super-cells;

FIG. 18 is a method for designing a boundary scan register, according to an embodiment of the invention.

DETAILED DESCRIPTION OF PREFERRED EMBODIMENTS

The following description relates to a certain configuration of a super-cell. It is noted that the invention can be applied to other cell configurations without departing from the scope of the invention.

Figure 16:
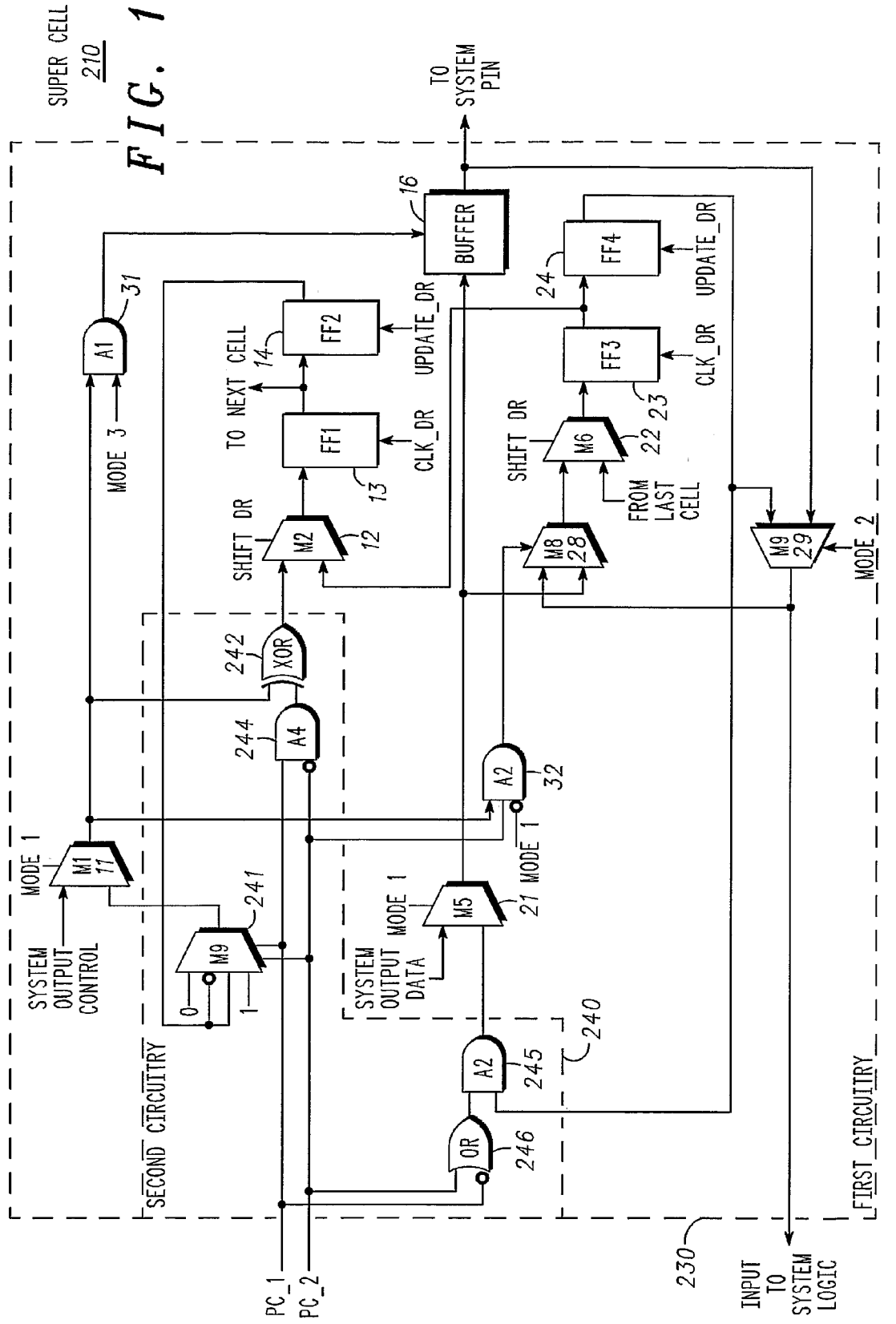
FIG. 16 illustrates a boundary scan super-cell, according to an embodiment of the invention.

FIG. 16 illustrates a boundary scan super-cell 210, according to an embodiment of the invention. Conveniently, the boundary super-cell 210 is included within an integrated circuit 200.

The boundary scan super-cell 210 includes first circuitry 230 such as prior art super-cell 72 that includes a second type boundary scan cell and a seventh type boundary scan cell. The first circuitry is adapted to be coupled to an integrated circuit pin of one out of two possible types.

AND gate A2 was modified to include an additional input that is connected to receive signal PC2.

The boundary scan super-cell 210 also includes a second circuitry 240, that is connected to the first circuitry 230, wherein the second circuitry 240 is adapted to receive at least one pin type signal indication and in response allows the boundary scan super-cell 210 to be connected to at least a third type of an integrated circuit pin.

Conveniently, the second circuitry 240 includes an input multiplexer M9 241, a XOR gate 242, two AND gates 244 and 245 and an OR gate 246. Each of AND gate 244 and OR gate 246 includes an inverting input and a non-inverting input.

The at least one pin type indication signal includes two signals—Pin Configuration 1 (PC1) and Pin Configuration 2 (PC2). Super-cell 210 operates as a bi-directional or tri-state cell when PC1 is low and PC2 is high. Super-cell 210 operates as an input only cell when both PC1 and PC2 are low. Super-cell 210 operates as an open collector output cell or open collector bidirectional cell when PC2 is low and PC1 is high. Super-cell 210 operates as an two state output cell when both PC1 and PC2 are high.

The at least one pin type indication signal can be easily changed during various design stages. Once the final configuration of the pins is determined these signals are set. Typically, the required voltage level can by easily achieved by either grounding or connecting to a power supply the circuitry that provides PC1 and/or PC2.

The output of multiplexer M1 11 receives two data inputs signals that are a system control signal and an output signal of multiplexer M9 241. m9 241 is controlled by PC1 (LSB) and PC2 (MSB). It receives as input a zero signal ("0"), the output signal of FF2 14, an inverted output signal of FF2 14 and a high signal ("1"). When both PC2 and PC1 are high the high signal is selected.

The output of M1 11 is connected to an input of AND gate A1 31. The output of A1 31 is connected to an enable input of buffer 16. AND gate A4 244 receives PC1 and an inverter PC2. The output of A4 244 is connected to an input of XOR gate 242. The other input of XOR gate 242 is connected to the output of M1 11. Multiplexer M2 12 inputs are connected to the output of FF3 23 and to the output of XOR gate 242. M2 12 is controlled by SHIFT DR signal. The output of M2 12 is connected to the input of FF1 13 that is serially connected to FF2 14. The output of FF1 13 is provided to the next cell.

An OR gate 246 receives PC2 and an inverted PC1 signal. The output of OR gate 246 is connected to an input of AND gate A5 245. The second input of A5 245 receives an output signal of FF4 24. The output of A5 245 is connected to an input of M5 21. Another input of M5 21 receives as inputs a system output data signal. The output of M5 21 is connected to a data input of buffer 16 and to an input of multiplexer M8 28. An AND gate A2 32 receives an inverted MODE 1 signal and the output signal of M1 11 and sends a control signal to M8 28. M8 28 receives as input the output of M5 21 and an output signal from multiplexer M9 29. The output signal of M9 29 is the input to system logic signal. The output of M8 28 is connected to an input if M6 22 while another input is connected to a previous cell. M6 22 is controlled by SHIFT DR signal. The output of M6 22 is connected to FF3 23 that in turn is serially connected to FF4 24. The output of FF4 24 is connected to an input of M9 29.

MODE 1 is high during the execution of EXTEST and CLAMP instructions, low during the execution of PRELOAD, SAMPLE and INTEST instructions and is not provided (high impedance) during the execution of RUNBIST and HIGHZ instructions. MODE 2 is high during the execution of INTEST instruction, low during the execution of PRELOAD, SAMPLE and EXTEST instructions and is not provided (high impedance) during the execution of RUNBIST, CLAMP and HIGHZ instructions. MODE 3 is high during the execution of EXTEST, PRELOAD, SAMPLE and CLAMP instructions and is low during the execution of HIGHZ, RUNBIST and INTEST instructions.

Super-cell 210 can be adapted to operate with each pin type and greatly simplifies the design of the boundary scan register.

Figure 17:
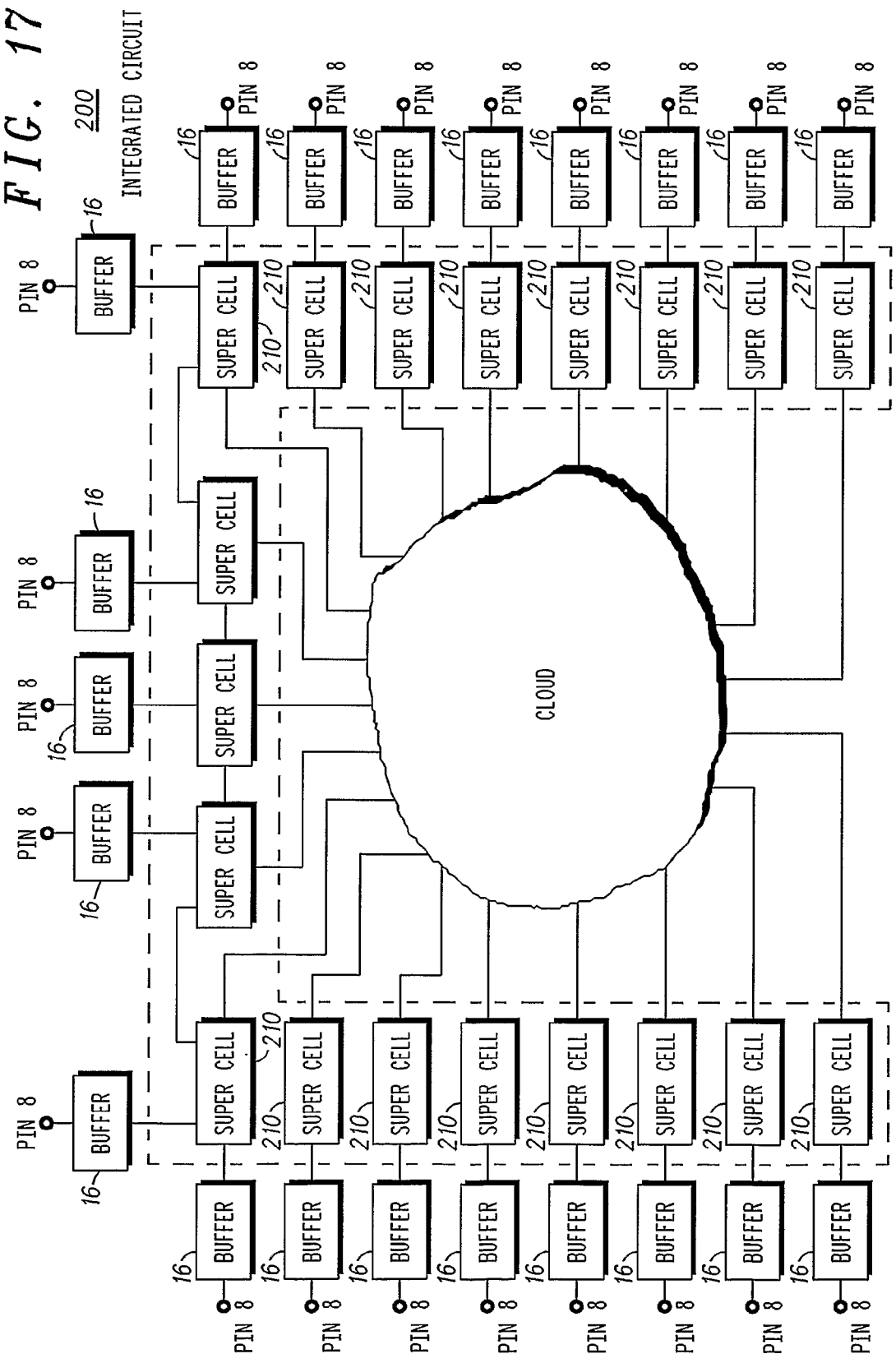
FIG. 17 illustrates an integrated circuit that includes a boundary scan register, according to an embodiment of the invention.

FIG. 17 illustrates an integrated circuit 200 that includes a boundary scan register 201, according to an embodiment of the invention. Boundary scan register 201 includes only super-cell 210. Each super-cell 210 can be adjusted to the type of pin connected to it by providing the appropriate PC1 and PC2 signals.

Conveniently, super-cell 210 can, in response to appropriate PC1 and PC2 signals, be adapted to be connected to an input only pin and alternatively to a two state buffer pin.

Figure 1:
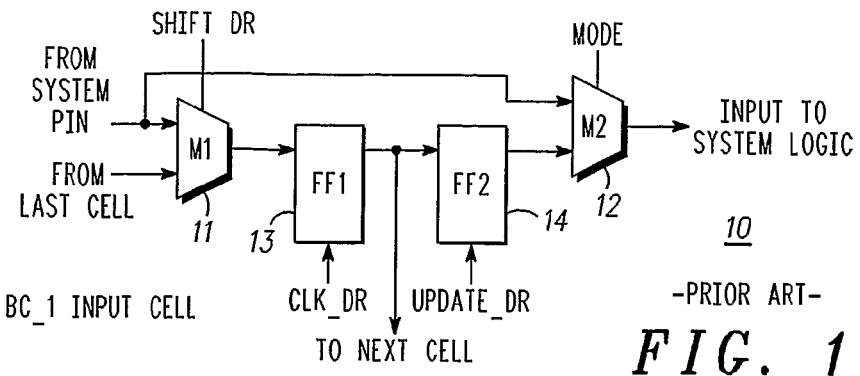
Figure 2:
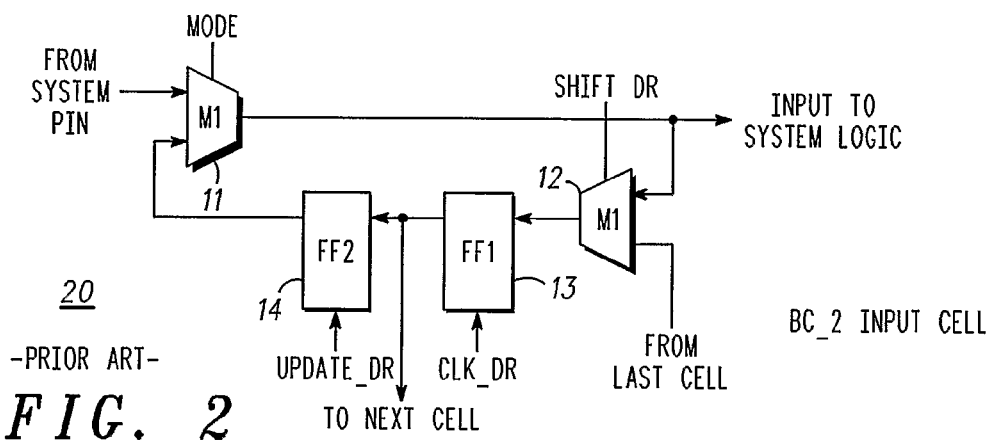
Figure 3:
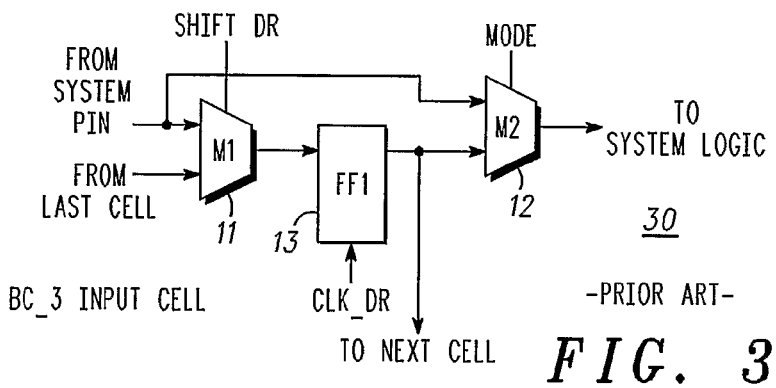
Figure 4:
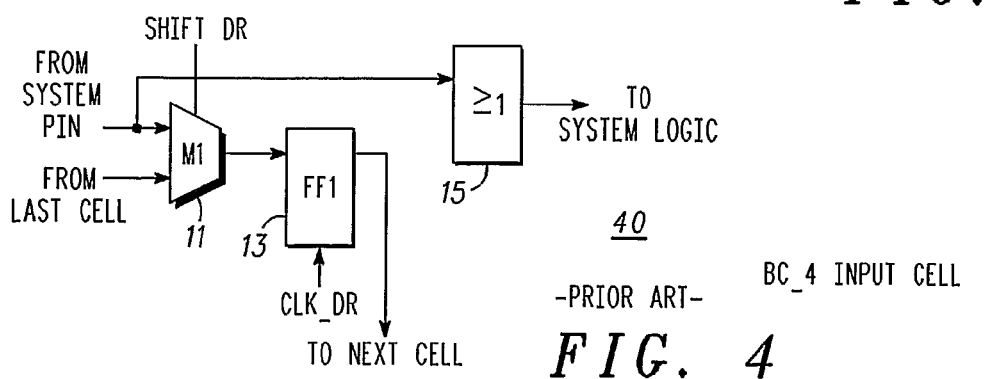
Figure 8:
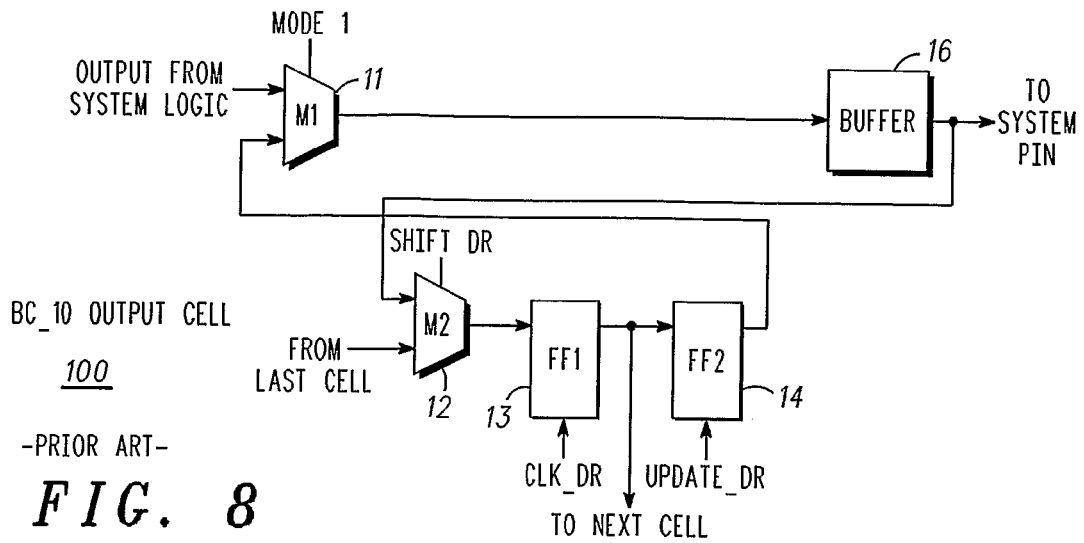
Figure 9:
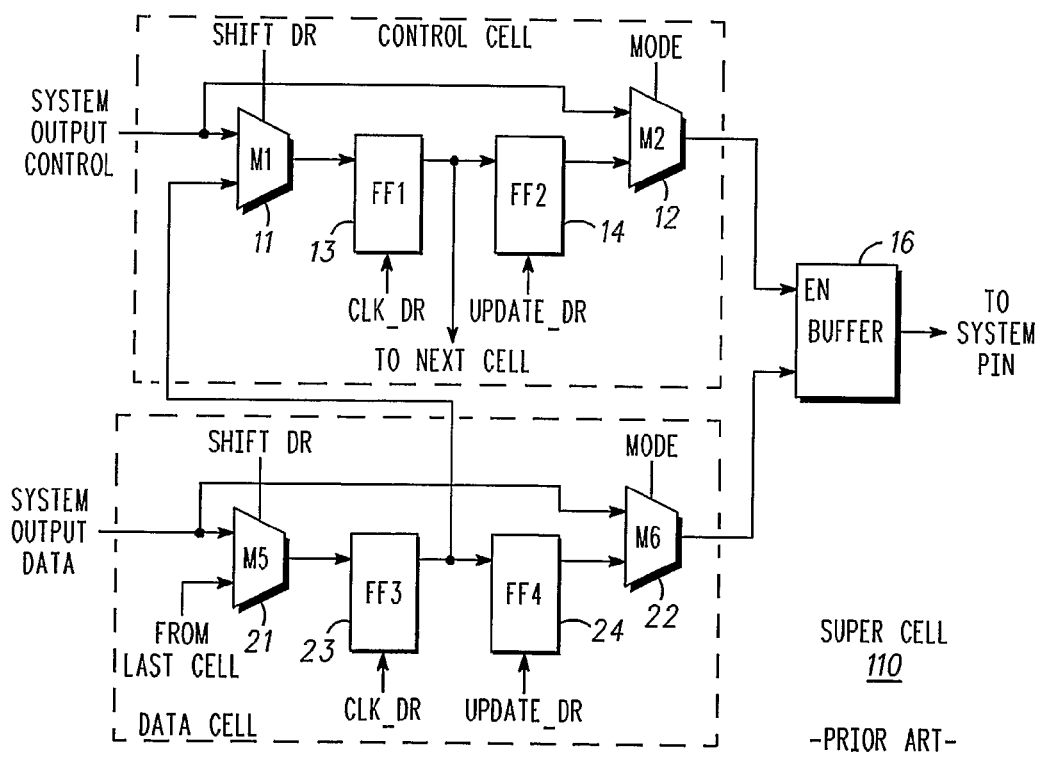
Figure 10:
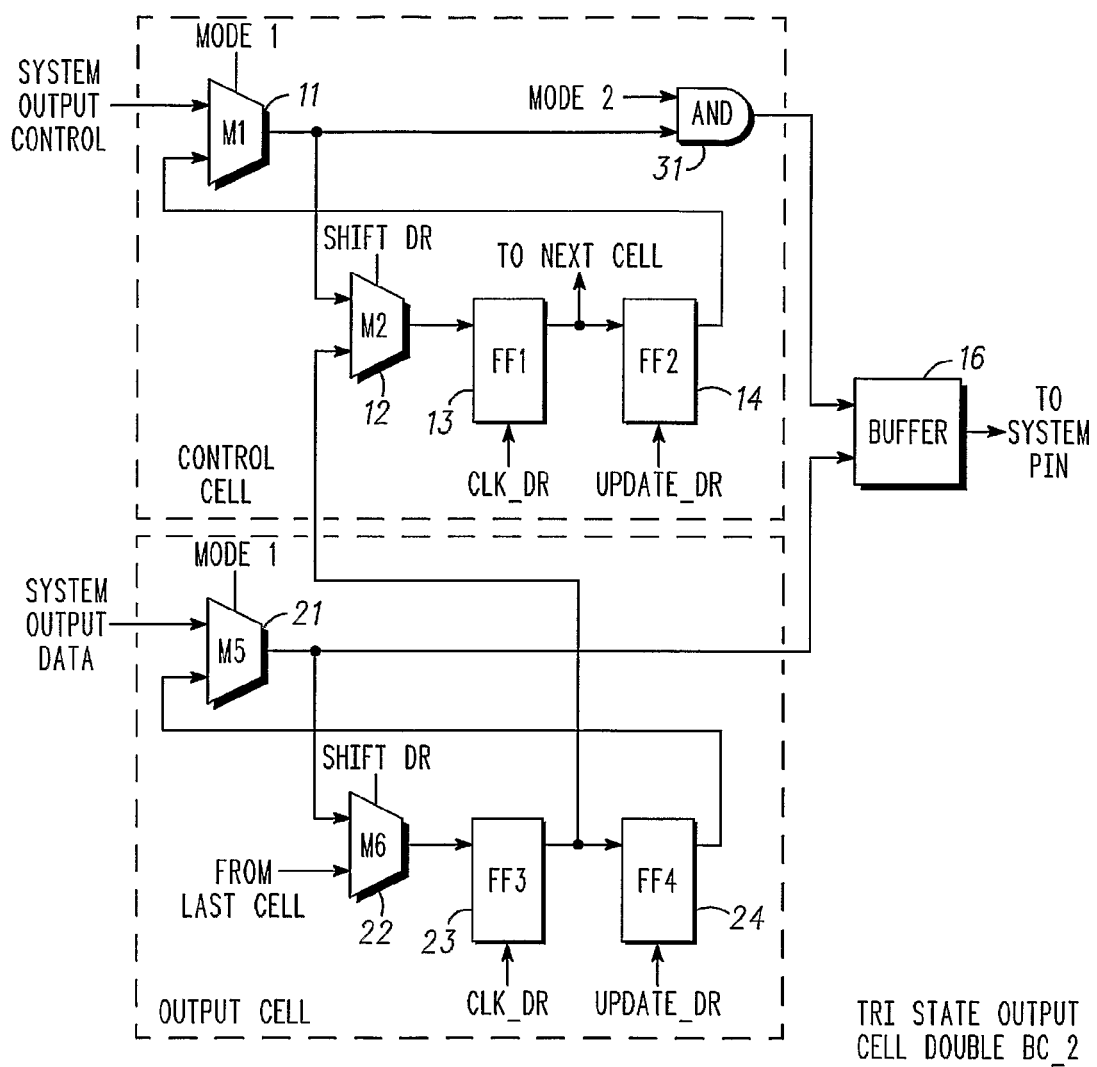
Figure 11:
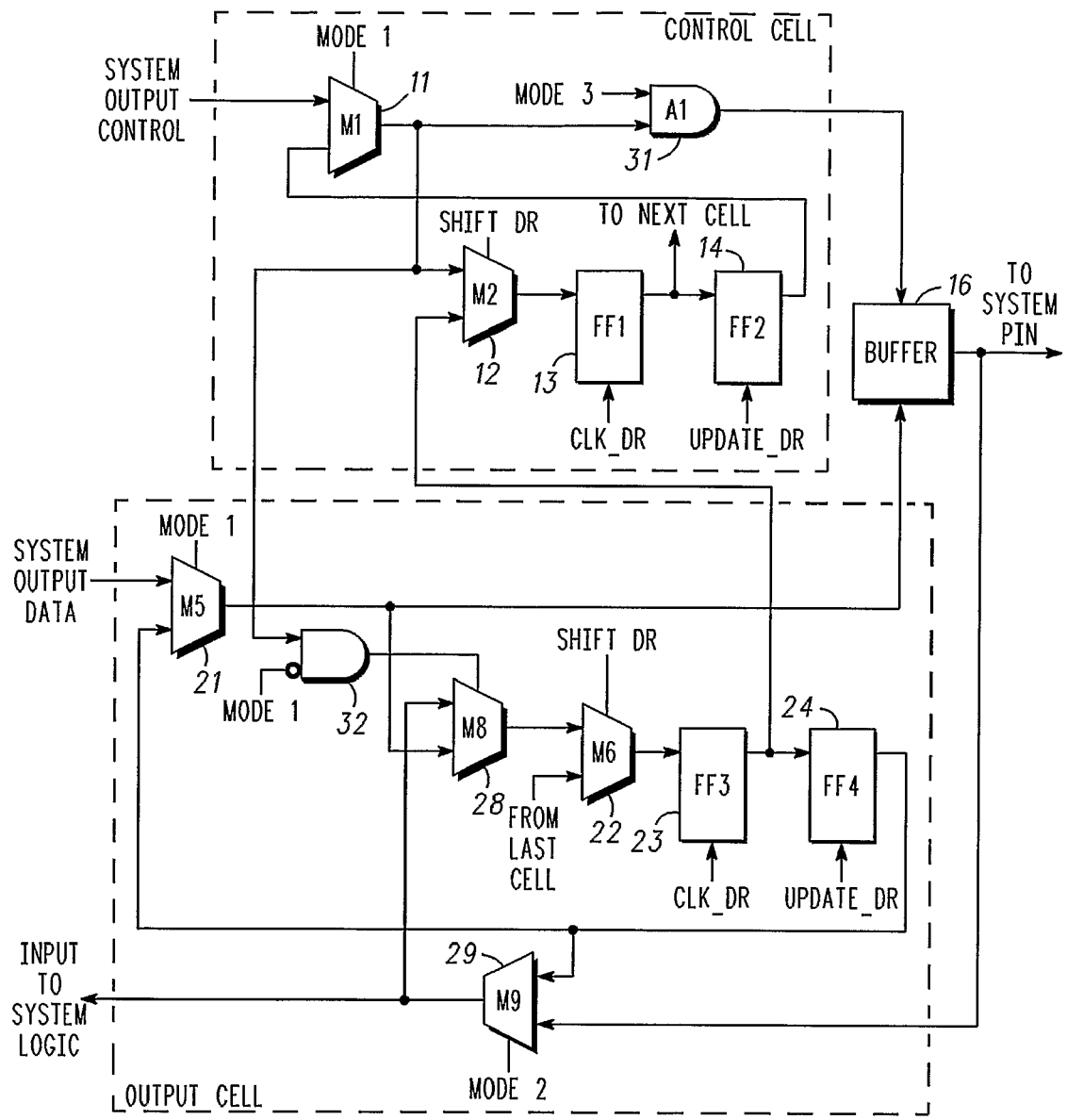
Figure 14:
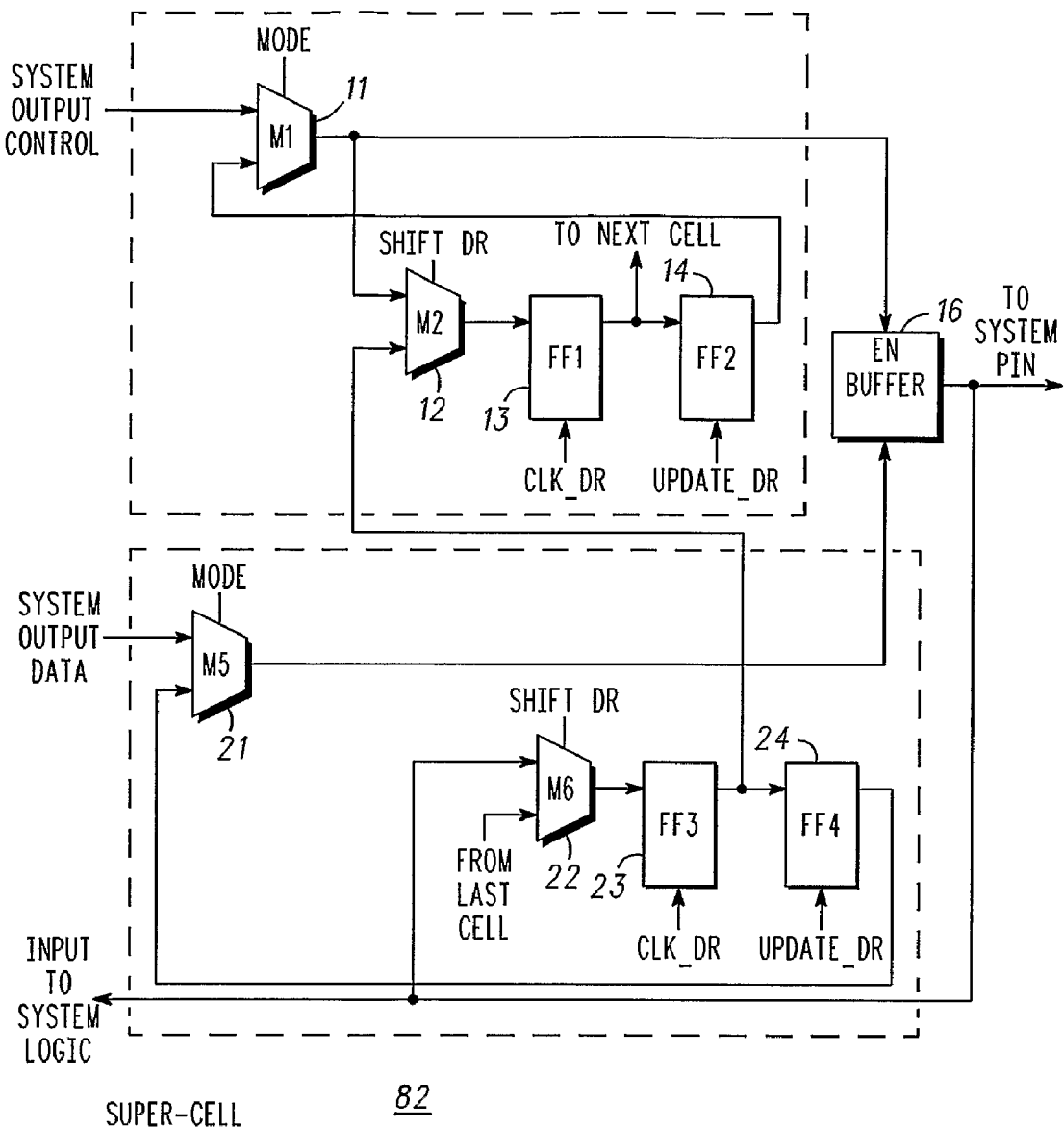
Figures 15, 18:
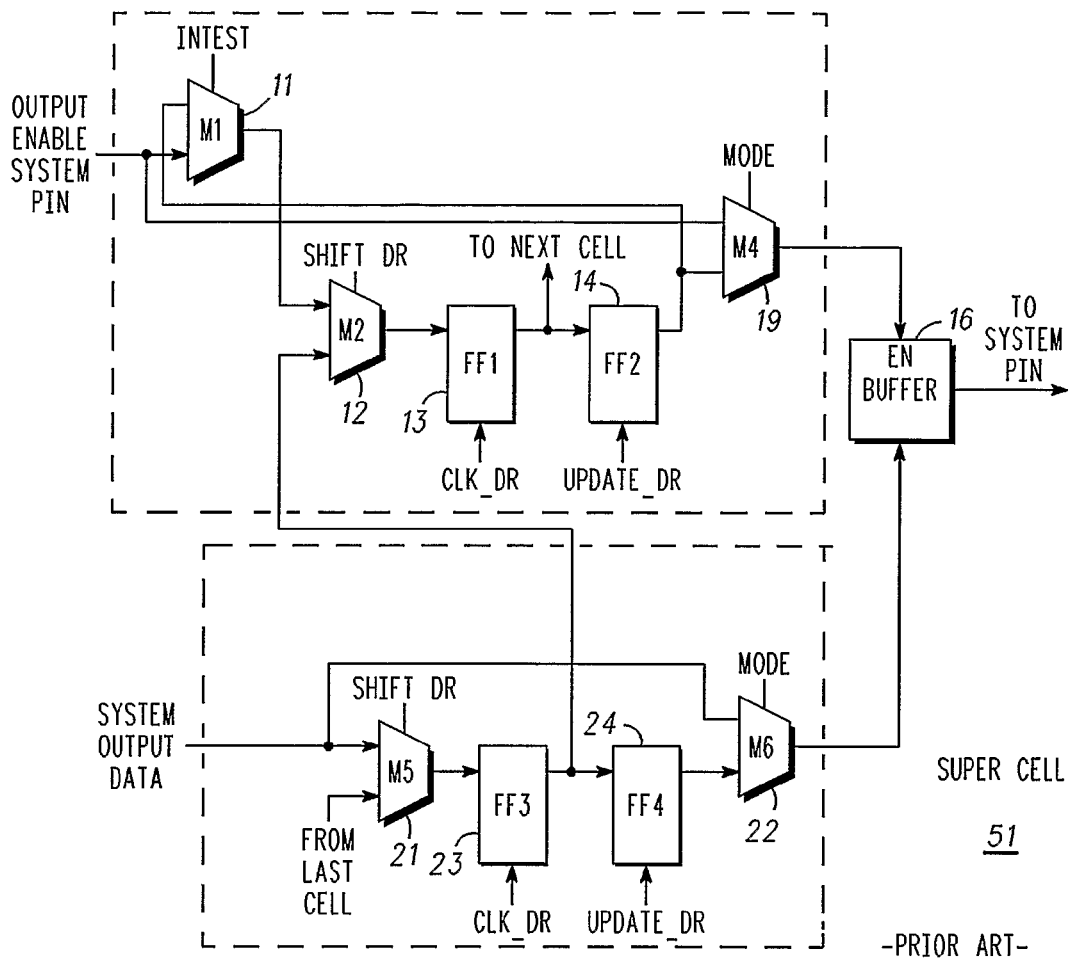

FIG. 18 is a method 300 for designing a boundary scan register, according to an embodiment of the invention.

Method 300 starts by stage 310 of providing an initial definition of a boundary scan register that includes identical super-cells adapted to be connected to multiple pin types.

Conveniently, each super-cell includes a first circuitry that is adapted to be connected to an integrated circuit pin of one out of two possible types, a second circuitry that is connected to the first circuitry. The second circuitry is adapted to receive at least one pin type indication signal and in response allows the boundary scan super-cell to be connected to at least a third type of an integrated circuit pin.

Stage 310 is followed by stage 320 of determining the configuration of each super-cell by providing the appropriate one or more pin type indication signals to each super-cell.

It is noted that method 300 can include multiple iterations of stage 320 and an additional stage 330 of changing at least one pin type.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. An integrated circuit that comprises a boundary scan super-cell, the boundary scan super-cell comprises:
    a first circuitry adapted to be coupled to at least one type of integrated circuit pin;
    a second circuitry, coupled to the first circuitry, wherein the second circuitry is adapted to receive at least one pin type indication signal and in response allows the boundary scan super-cell to be coupled to at least one additional type of an integrated circuit pin, wherein the second circuitry comprises:
    an input multiplexer;
    XOR gate;
    two AND gates; and
    an OR gate, wherein an AND gate and the OR gate comprises an inverting input and a non-inverting input.

2. The integrated circuit according to claim 1, wherein an additional type of an integrated circuit pin is an open drain output pin.

3. The integrated circuit according to claim 1, wherein an additional type of integrated circuit pin is an open drain bi-directional pin.

4. The integrated circuit according to claim 1, wherein an additional type of an integrated circuit pin is an input pin.

5. The integrated circuit according to claim 1, wherein an additional type of an integrated circuit pin is a two state buffer pin.

6. The integrated circuit according to claim 1, comprising a boundary scan register that comprises identical boundary scan super-cells.

7. The integrated circuit according to claim 1, wherein an additional type of an integrated circuit pin is an open drain output pin.

8. An integrated circuit that comprises a boundary scan super-cell, the boundary scan super-cell comprises:
- a first circuitry adapted to be coupled to at least one type of integrated circuit pin;
- a second circuitry, coupled to the first circuitry, wherein the second circuitry is adapted to receive at least one pin type indication signal and in response allows the boundary scan super-cell to be coupled to at least one additional type of an integrated circuit pin, wherein the first circuitry comprises a second type boundary scan cell and a seventh type boundary scan cell, wherein the second circuitry comprises:
- an input multiplexer;
- XOR gate;
- two AND gates; and
- an OR gate, wherein an AND gate and the OR gate comprises an inverting input and a non-inverting input.

9. The integrated circuit according to claim 8, wherein an additional type of an integrated circuit pin is an open drain output pin.

10. The integrated circuit according to claim 8, wherein an additional type of integrated circuit pin is an open drain bi-directional pin.

11. The integrated circuit according to claim 8, wherein an additional type of an integrated circuit pin is an input pin.

12. The integrated circuit according to claim 8, wherein an additional type of an integrated circuit pin is a two state buffer pin.

13. The integrated circuit according to claim 8, comprising a boundary scan register that comprises identical boundary scan super-cells.

* * * * *